United States Patent
Wu et al.

(10) Patent No.: US 7,261,828 B2
(45) Date of Patent: *Aug. 28, 2007

(54) BUMPING PROCESS

(75) Inventors: En-Chieh Wu, Kaohsiung (TW);
Chao-Fu Weng, Tainan (TW);
Chi-Long Tsai, Taitung (TW);
Min-Lung Huang, Kaohsiung (TW);
Chia-Ming Chuang, Fengshan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 291 days.

This patent is subject to a terminal disclaimer.

(21) Appl. No.: 10/753,318

(22) Filed: Jan. 9, 2004

(65) Prior Publication Data
US 2004/0188378 A1    Sep. 30, 2004

(30) Foreign Application Priority Data
Mar. 25, 2003  (TW) ............................. 92106678 A

(51) Int. Cl.
*H01B 13/00*    (2006.01)
(52) U.S. Cl. ............................ 216/13; 216/41; 216/83; 216/95; 216/100; 252/79.1; 252/79.2
(58) Field of Classification Search ................ 216/13, 216/41, 83, 95, 100; 252/79.1, 79.2
See application file for complete search history.

(56) References Cited

U.S. PATENT DOCUMENTS

| | | | | |
|---|---|---|---|---|
| 3,585,461 | A | * | 6/1971 | Eynon et al. ............... 257/751 |
| 3,628,243 | A | * | 12/1971 | Phol et al. ................... 29/849 |
| 5,171,711 | A | * | 12/1992 | Tobimatsu .................. 438/614 |
| 5,508,229 | A | | 4/1996 | Baker |
| 5,780,363 | A | * | 7/1998 | Delehanty et al. .......... 438/748 |
| 6,033,764 | A | * | 3/2000 | Balents et al. .............. 428/209 |
| 6,417,089 | B1 | * | 7/2002 | Kim et al. ................... 438/612 |
| 6,570,251 | B1 | * | 5/2003 | Akram et al. ............... 257/738 |
| 6,664,128 | B2 | * | 12/2003 | Tong et al. ................. 438/106 |
| 2002/0076911 | A1 | * | 6/2002 | Lin ............................. 438/613 |
| 2004/0092092 | A1 | * | 5/2004 | Yang ........................... 438/612 |

* cited by examiner

*Primary Examiner*—Shamim Ahmed
(74) *Attorney, Agent, or Firm*—Bacon & Thomas, PLLC

(57) ABSTRACT

A method of forming a plurality of bumps over a wafer mainly comprises providing the wafer having a plurality of bonding pads formed thereon, forming an under bump metallurgy (UBM) layer over the bonding pads wherein the UBM layer includes an adhesive layer, for example a titanium (Ti) layer or an aluminum (Al) layer, and at least one electrically conductive layer formed on the adhesive layer, removing the portions of the electrically conductive layer located outside the bonding pads, forming a plurality of bumps over the residual portions of the electrically conductive layer disposed above the bonding pads, etching the adhesive layer located outside the bumps, and then reflowing the bumps.

17 Claims, 8 Drawing Sheets

BUMPING PROCESS

BACKGROUND OF THE INVENTION

1. Field of Invention

This invention relates to a bumping process. More particularly, the present invention is related to a method for etching the adhesive layer made of a titanium layer or an aluminum layer of the UBM layer (Under Bump Metallurgy layer) through a sulfuric acid solution serving as an etchant.

2. Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. Moreover, compared with a wire-bonding package or a tape automated bonding (TAB) package, a flip-chip, package uses a shorter electrical path on average and has a better overall electrical performance. In a flip-chip package, the bonding pads on a die and the contacts on a substrate are connected together through a plurality of bumps formed by the method of bumping process. Accordingly, the technology of bumping process becomes more and more important in the advanced packaging fields.

Referring to FIG. 1A, it shows a flow chart illustrating the process flow of a conventional bumping process. The conventional bumping process mainly comprises the following steps. Firstly, a substrate is provided as shown in the step of S100. The substrate may be a silicon base or a wafer. Next, an under bump metallurgy layer is formed on the substrate as shown in the step of S102. Generally speaking, the under bump metallurgy is made of an adhesive layer, a barrier layer and a wetting layer. Then, the step S104 of patterning the barrier layer and the wetting layer is performed to define the locations for disposing bumps. Namely, a photo-resist is formed to cover the portions of the wetting layer and the barrier layer for disposing the bumps thereon and then the residual portions of the wetting layer and the barrier layer not covered by the photo-resist layer are removed to expose the adhesive layer. Afterwards, as shown in the step of S106, another photo-resist layer is provided to cover the exposed adhesive layer to expose the residual portions of the wetting layer, and the step of plating process is then performed to form solder bumps on the residual portions of the wetting layer. Next, as shown in the step of S108, the portions not covered by the solder bumps are removed. Finally, the solder bumps are reflowed (step of S110) to be fixed securely on the residual portions of the wetting layer and shaped into a ball-like shape.

Next, referring to FIG. 1B, it shows a flow chart illustrating the process flow of another conventional bumping process. This conventional bumping process mainly comprises the following steps. Firstly, a substrate is provided as shown in the step of S200. The substrate may be also a silicon base or a wafer. Next, an under bump metallurgy layer is formed on the substrate as shown in the step of S202. Generally speaking, the under bump metallurgy is made of an adhesive layer, a barrier layer and a wetting layer. Then, the step of S204 of forming bumps above the bonding pads of the substrate and on the portions of the wetting layer that are not covered by a patterned photo-resist layer is performed. Next, as shown in the step of S206, the bumps are served as masks so as to perform the removing process to remove the portions of the wetting layer and the barrier layer not covered by the bumps so as to expose the adhesive layer. Then, as shown in the step of S208, the portions of the adhesive layer not covered by the wetting layer and the barrier layer are removed. Finally, as shown in the step of S210, the bumps are reflowed to be fixed on the residual portions of the wetting layer and to be shaped into ball-like shape.

In the aforementioned conventional bumping processes, the under bump metallurgy layer applicable to the bumping process for the copper wafer mainly comprises a titanium layer, a nickel-vanadium layer and a copper layer. Therein, a hydrogen-fluorine solution (HF) is usually taken as an etchant for patterning the copper layer; a sulfuric acid solution ($H_2SO_4$) or a dilute phosphoric solution mainly comprising deionized water (DI water), phosphoric acid ($CH_3COOH$), acetic acid ($H_3PO4$) and hydrogen peroxide ($H_2O_2$), wherein the composition of said etchant can be refereed to U.S. Pat. No. 5,508,229, is taken as an etchant to define the nickel-vanadium layer. A hydrogen-fluorine solution is also usually taken as the etchant to define or pattern the titanium layer. However, the etchant (said hydrogen-fluorine solution) is very dangerous so that said hydrogen-fluorine solution is not able to be applicable to the bumping process.

Besides, the under bump metallurgy layer applicable to the bumping process for the aluminum wafer mainly comprises an aluminum layer, a nickel-vanadium layer and a copper layer. The etchant for patterning the aluminum layer comprises phosphoric acid, acetic acid and deionized water (DI). Therein, 83% of the etchant is phosphoric acid; 11% of the etchant is acetic acid; and 6% of the etchant is deionized water. However, the mentioned-above etchant is able to attack the bumps so as to make the volume of the bumps smaller and smaller. In such a manner, the precision of the volume of the bumps is not able to be well controlled. Accordingly, there are restrictions to take the hydrogen-fluorine solution and the phosphoric acid solution as etchants.

Moreover, in the conventional bumping process, when a portion of the photo-resist layer is left, the surface of the bumps will be contaminated. In addition, the etchant taken to remove the UBM layer will also contaminate the surface of the bumps.

Therefore, providing another method for forming bumps to solve the mentioned-above disadvantages is the most important task in this invention.

SUMMARY OF THE INVENTION

In view of the above-mentioned problems, an objective of this invention is to provide a method of forming bumps, and more particularly, a method for etching the adhesive layer made of a titanium layer or an aluminum layer of the UBM layer (Under Bump Metallurgy layer) through a sulfuric acid solution serving as an etchant.

To achieve these and other advantages and in accordance with the purpose of the invention, as embodied and broadly described herein, the invention provides a method of taking a sulfuric acid solution as an etchant to etch the adhesive layer made of a titanium layer or an aluminum layer of the UBM layer (Under Bump Metallurgy layer). Therein, the concentration of said sulfuric acid solution ranges from about 50% to about 96% and the reaction temperature of said sulfuric acid solution for performing the etching process ranges between about 60° C. and about 90° C.

As mentioned above, said etchant in this invention not only avoids attacking said bumps to reduce the volume of the bumps so as to control the volume of the bumps more precisely but also can be applicable to the bumping process for both the aluminum wafer and the copper wafer. Moreover, said etchant is more safe and able to increase the reliability of the bumping process.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1A:
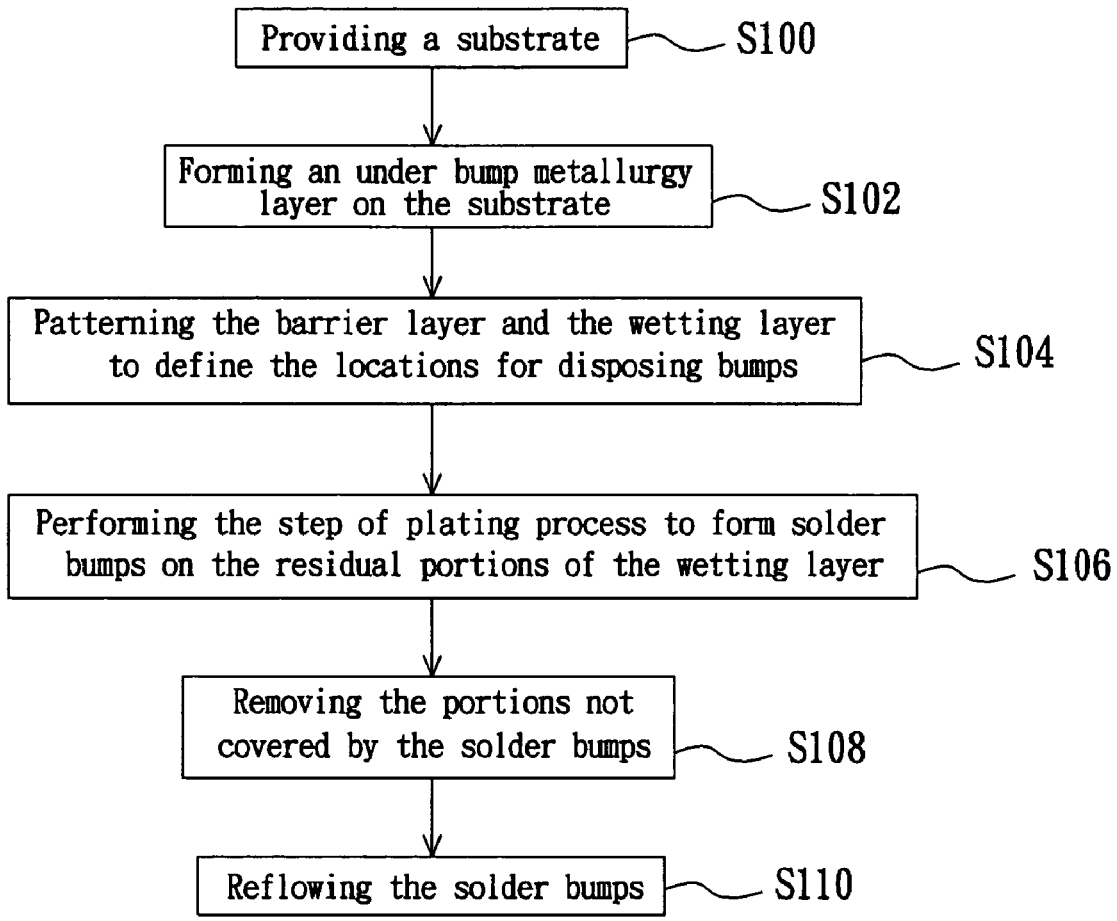
FIG. 1A illustrates a flow chart of the process flow of a conventional bumping process.
Figure 1B:
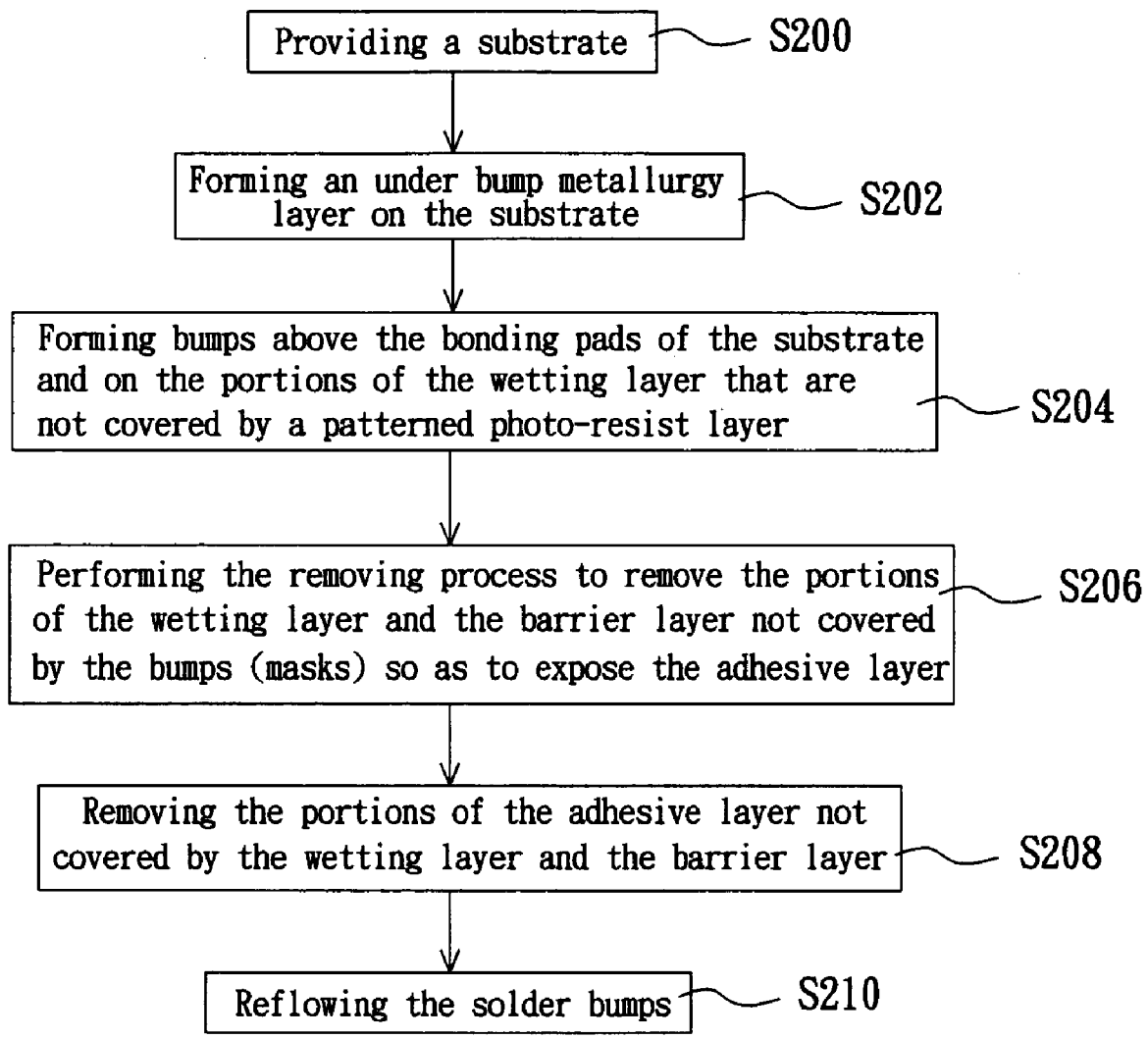
FIG. 1B illustrates a flow chart of the process flow of another conventional bumping process.

The method of forming bumps according to the preferred embodiment of this invention will be described herein below with reference to the accompanying drawings, wherein the same reference numbers are used in the drawings and the description to refer to the same or like parts.

FIGS. 2 to 11 are partially enlarged cross-sectional views showing the progression of steps for forming a bump according to the first preferred embodiment of this invention.

Figure 2:
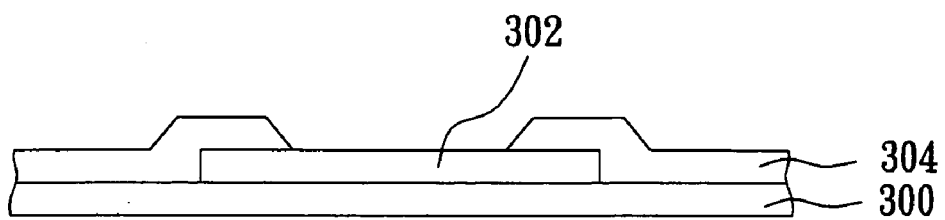
FIGS. 2 to 11 are partially enlarged cross-sectional views showing the progression of steps for forming a bump according to the first preferred embodiment of this invention.

As shown in FIG. 2, a silicon wafer 300 having a plurality of bonding pads 302 and a passivation layer 304. Therein, the passivation layer 304 covers the active surface of the silicon wafer 300 and exposes the bonding pads 302.

Figure 3:
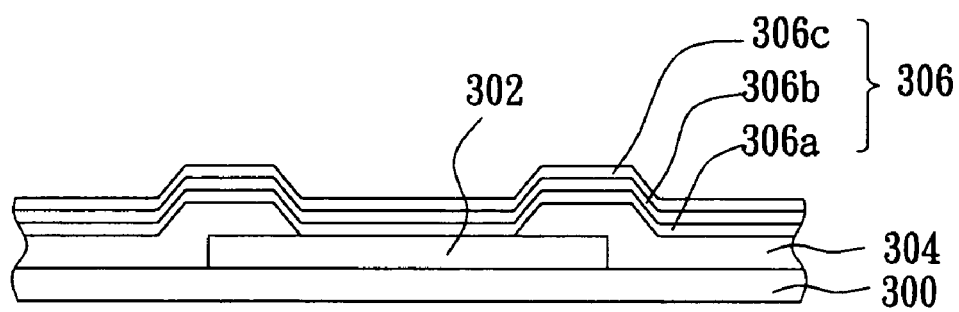

Next, referring to FIG. 3, an under bump metallurgy layer 306 is formed on the active surface of the silicon wafer 300. Said under bump metallurgy layer 306 mainly comprises an adhesive layer 306a, for example a titanium layer or a copper layer, a barrier layer 306b and a wetting layer 306c. Said under bump metallurgy layer may comprise a titanium layer, a nickel-vanadium and a copper in sequence. Moreover, the under bump metallurgy 306 layer may also comprise an aluminum layer, a nickel-vanadium layer and a copper layer. In addition, the mentioned-above under bump metallurgy layer 306 can only comprise two layers made of a titanium layer and a copper layer which comprises an adhesive layer and one electrically conductive layer, or said under-bump metallurgy layer comprises four layers made of an aluminum layer, a titanium layer, a nickel-vanadium layer and a copper layer.

Figure 4:
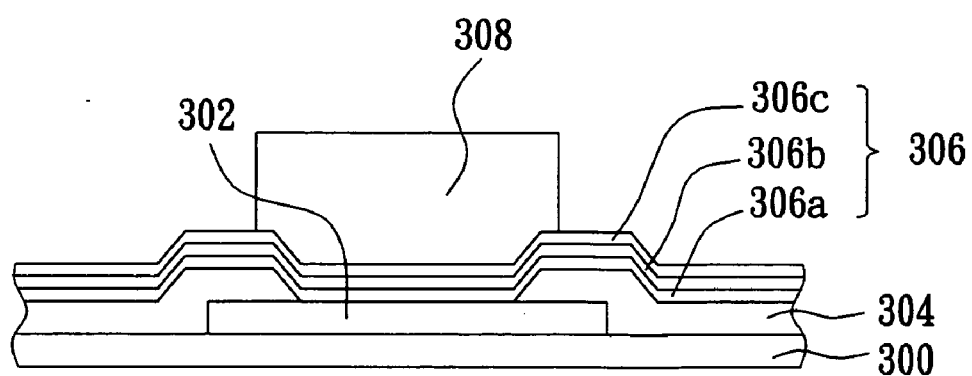

Next, referring to FIG. 4, a photo-resist layer 308 is formed on the portions of the under bump metallurgy layer 306 which are disposed above the bonding pads 302 in order to expose the residual portions of the barrier layer 306b and the wetting layer 306c not covered by the photo-resist layer.

Figure 5:
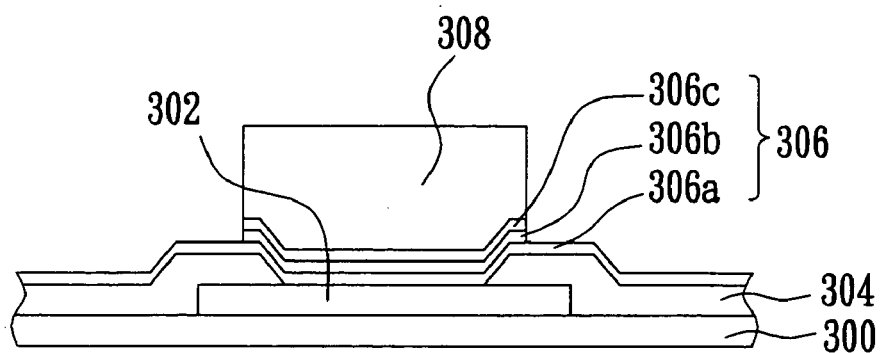

Afterwards, as shown in FIG. 5, the photo-resist layer is taken as a mask to remove the residual portions of the barrier layer 306b and the wetting layer 306c not covered by the photo-resis layer so as to expose the adhesive layer 306a. For example, the nickel-vanadium layer of the under bump metallurgy layer can be removed by the etchant made of a sulfuric acid solution or a dilute phosphoric solution comprising deionized water (DI water), phosphoric acid, acetic acid and hydrogen peroxide (the composition of said etchant can be refereed to U.S. Pat. No. 5,508,229); and the copper layer of the under bump metallurgy layer can be etched away by the etchant made of a hydrogen-fluorine solution or a aquafortis solution.

Figure 6:
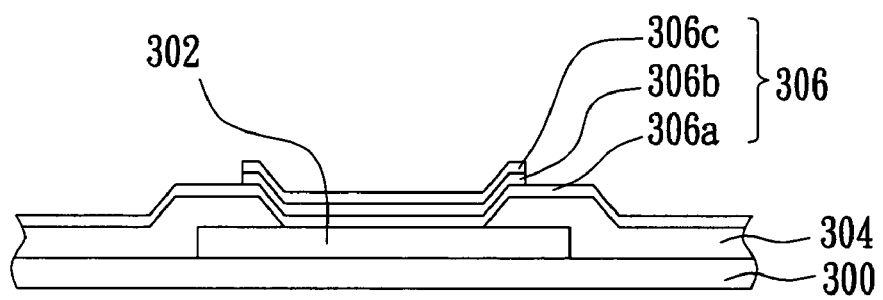
Figure 7:
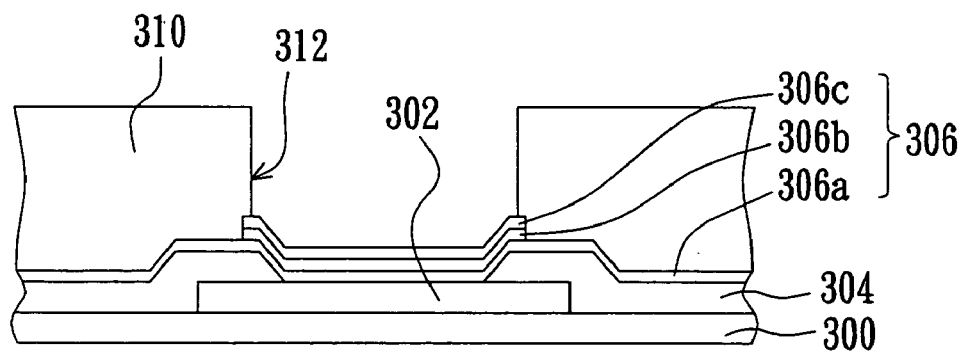

Referring to FIG. 6, after the step of patterning the wetting layer 306c and the barrier layer 306b, the step of removing the photo-resist layer 308 is performed. Next, as shown in FIG. 7, another photo-resist layer 310 is formed above the active surface of the silicon wafer 300 and a plurality of openings 312 are formed to expose the predetermined locations for forming bumps. Therein, for example, the openings 312 expose the portions of the wetting layer 306c disposed above the bonding pads 302.

Figure 8:
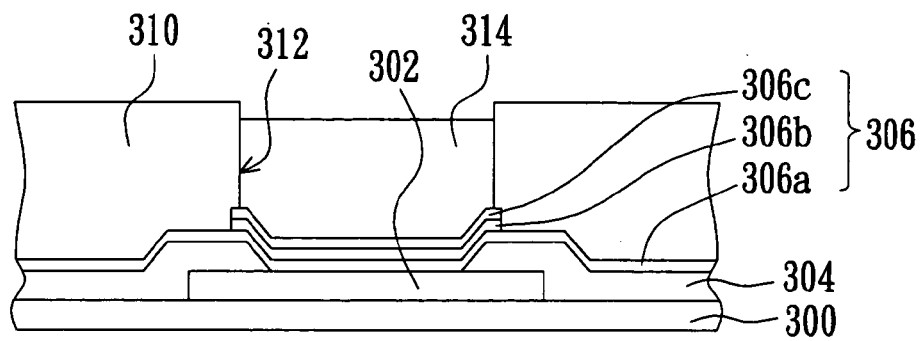

Next, referring to FIG. 8, a solder material is filled in the openings 312 so as to form a plurality of solder bumps 314. Therein, the solder material is formed by the method of plating and said solder material may be selected from the material of one of lead-free and solder eutectic. As mentioned above, the adhesive layer 306a connects the patterned wetting layer 306c and the patterned barrier layer 306b so as to perform the plating process to form solder bumps 314.

Figure 9:
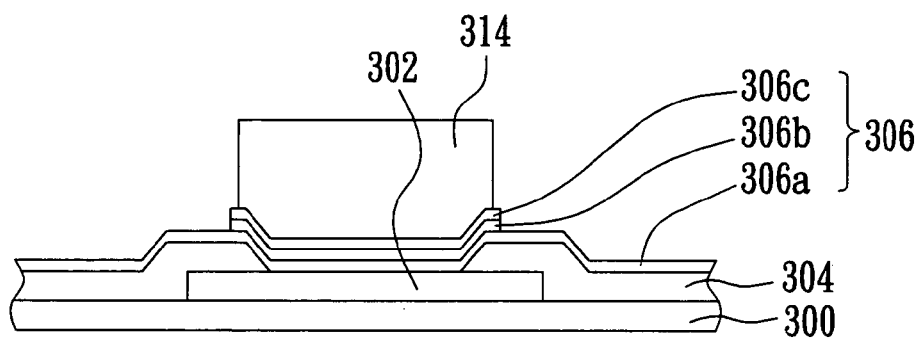
Figure 10:
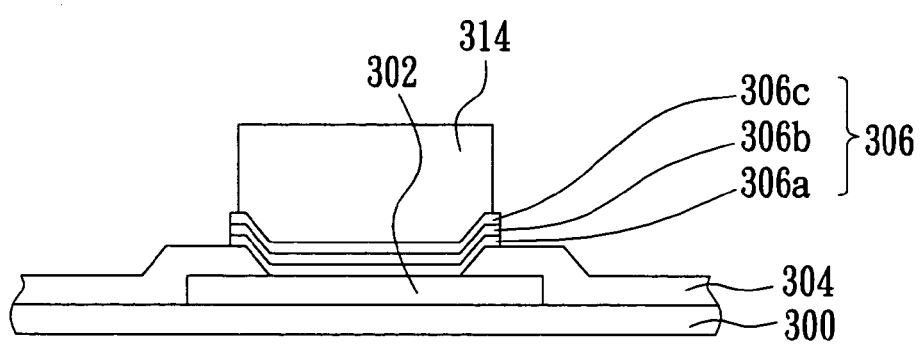

Moreover, as shown in FIG. 9 and FIG. 10, after the bumps 314 are formed and the photo-resist layer 310 is removed, the bumps 314 will be taken as masks to remove the adhesive layer 306a not covered by the bumps 314. Finally, the passivation layer 304 will be exposed.

In this embodiment, the concentration of said sulfuric acid solution ranging from about 50% to about 96% is taken as the etchant to etch the adhesive layer 306a. Due to the difficulty of the reaction between the sulfuric acid solution and the bumps, the bumps will not be easily attacked by the etchant to cause the volume of the bumps to be reduced. In addition, it is easier to control the volume of the bumps so as to get the more precision of the volume of the bumps. Besides, said sulfuric acid solution is able to be applicable to the bumping process for both the aluminum wafer and the copper wafer. Moreover, said sulfuric acid solution is not harmful to the human and able to increase the reliability of the bumping process.

Figure 11:
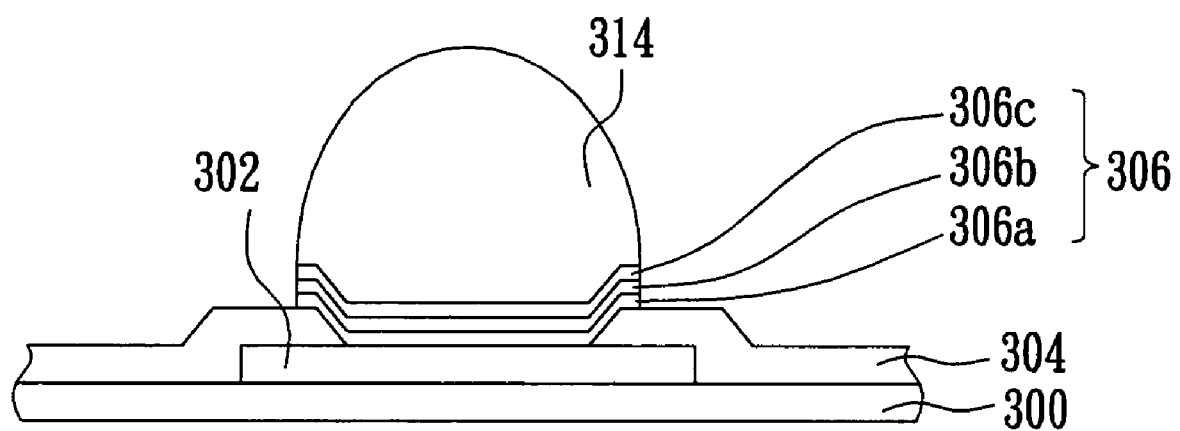

Finally, as shown in FIG. 11, a reflowed process is performed to shape the bumps into a ball-like shape.

Next, as shown from FIGS. 12 to 17, they are partially enlarged cross-sectional views showing the progression of steps for forming a bump according to the second preferred embodiment of this invention.

Figure 12:
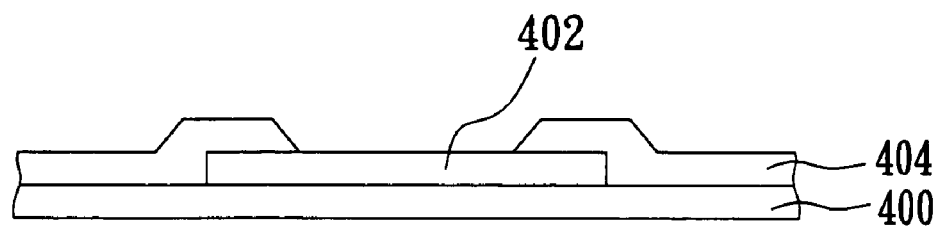
FIGS. 12 to 17 are partially enlarged cross-sectional views showing the progression of steps for forming a bump according to the second preferred embodiment of this invention.

Next, referring to FIG. 12, a silicon wafer 400 having a plurality of bonding pads 402 and a passivation layer 404. Therein, the passivation layer 404 covers the active surface of the silicon wafer 400 and exposes the bonding pads 402.

Figure 13:
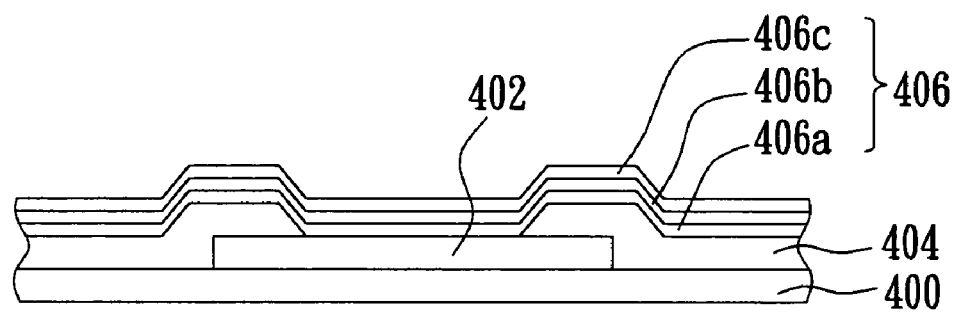

Afterwards, referring to FIG. 13, an under bump metallurgy layer 406 is formed on the active surface of the silicon wafer 400. Said under bump metallurgy layer 406 mainly comprises an adhesive layer 406a, for example a titanium layer or a copper layer, a barrier layer 406b and a wetting layer 406c. The under bump metallurgy layer 406 may comprises a titanium layer, a nickel-vanadium layer and a copper layer in sequence. Moreover, the under bump metallurgy layer may also comprise an aluminum layer, a nickel-vanadium layer and a copper layer. In addition, the mentioned-above under bump metallurgy layer 406 can only comprise two layers made of a titanium layer and a copper layer, or said under-bump metallurgy layer comprises four layers made of an aluminum layer, a titanium layer, a nickel-vanadium layer and a copper layer.

Figure 14:
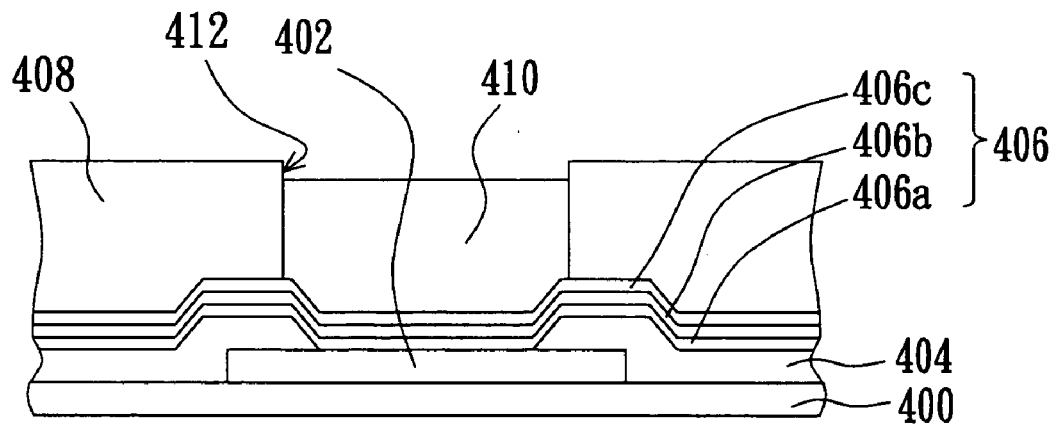

Next, referring to FIG. 14, a photo-resist layer 408 is formed above the active surface of the silicon wafer 400 and a plurality of openings 412 are formed to expose the predetermined locations for forming bumps 410. Therein, for example, the openings 412 expose the portions of the wetting layer 406c disposed above the bonding pads 402. Then, a solder material is filled in the openings 412 so as to form a plurality of solder bumps 410. Therein, the solder material is formed by the method of plating and said solder material may be selected from the material of one of lead-free solder and solder eutectic.

Figure 15:
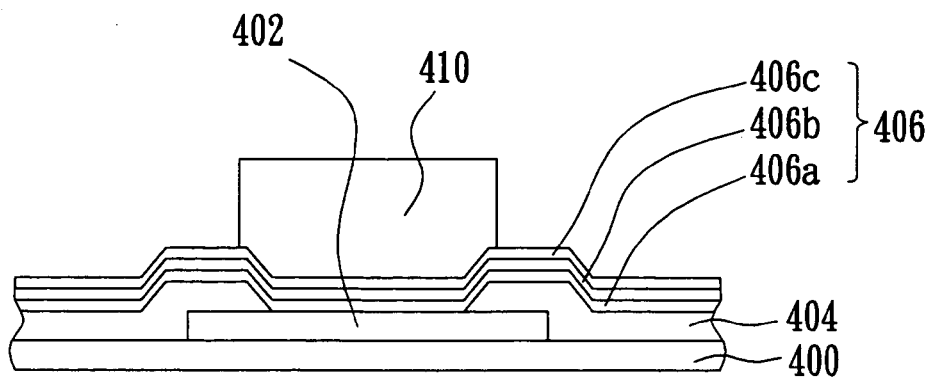
Figure 16:
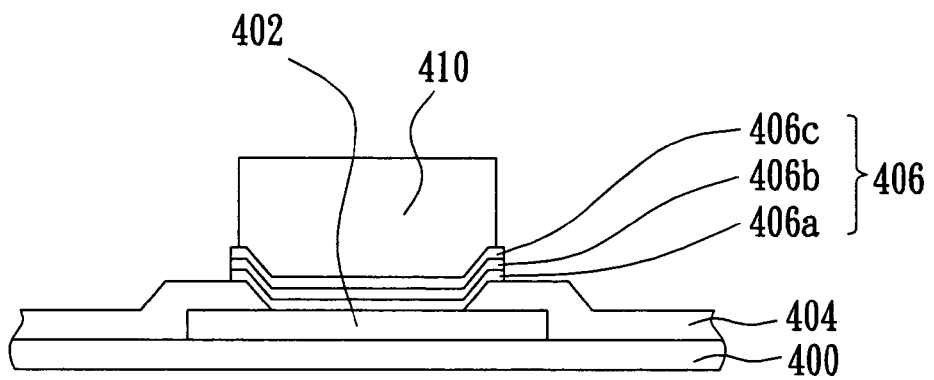

Moreover, as shown in FIG. 15 and FIG. 16, after the bumps 410 are formed and the photo-resist layer 408 is removed, the solder bumps 410 will be taken as masks to remove the adhesive layer 406a, the barrier layer 406b and the wetting layer 406c not covered by the bumps 410 to expose the passivation layer 404.

In this second embodiment, the nickel-vanadium layer of the under bump metallurgy layer 406 can be removed by the etchant made of a sulfuric acid solution or a dilute phosphoric solution comprising deionized water (DI water), phosphoric acid, acetic acid and hydrogen peroxide (the composition of said etchant can be refereed to U.S. Pat. No. 5,508,229); and the copper layer of the under bump metallurgy layer can be etched away by the etchant made of a hydrogen-fluorine solution or a aquafortis solution.

As mentioned above, the concentration of said sulfuric acid solution ranging from about 50% to about 96% is taken as the etchant to etch the adhesive layer 306a. Due to the difficulty of the reaction between the sulfuric acid and the bumps, the bumps will not be easily attacked by the etchant to cause the volume of the bumps to be reduced. In addition, it is easier to control the volume of the bumps so as to get the more precision of the volume of the bumps. Besides, said sulfuric acid solution is able to be applicable to the bumping process for both the aluminum wafer and the copper wafer. Moreover, said sulfuric acid solution is not harmful to the human and able to increase the reliability of the overall bumping process.

Figure 17:
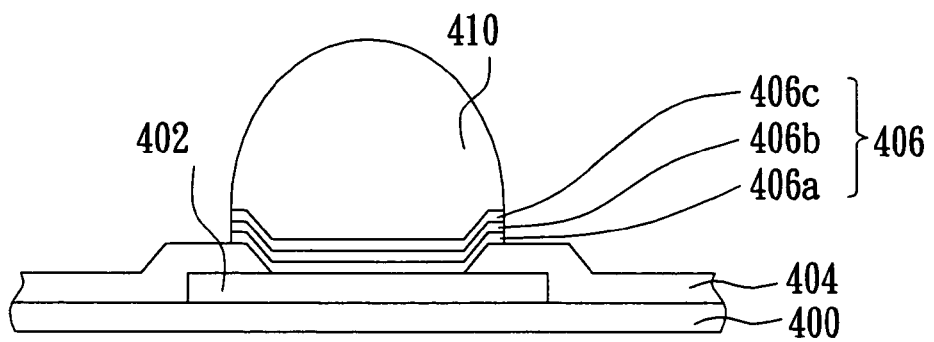

Finally, as shown in FIG. 17, a reflowed process is performed to shape the bumps 410 into a ball-like shape.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further comprises a plurality of bonding pads formed on the active surface and a passivation layer formed on the active surface to expose the bonding pads, the method comprising the steps of:

forming an under bump metallurgy layer over the active surface of the wafer, wherein the under bump metallurgy layer comprises an adhesive layer and an electrically conductive layer disposed on the adhesive layer and covering the bonding pads and the passivation layer;

removing portions of the electrically conductive layer not disposed above the bonding pads to leave un-removed portions of the electrically conductive layer on the bonding pads;

forming a plurality of bumps on the un-removed portions of the electrically conductive layer; and removing portions of the adhesive layer not covered by the bumps by an etchant, wherein the etchant is an sulfuric acid solution and the concentration of the sulfuric acid solution ranges from about 50% to about 96%.

2. The method of claim 1, wherein the adhesive layer is made of a material selected from one of titanium and copper.

3. The method of claim 1, wherein the step of removing the adhesive layer is performed at a temperature ranging from about 60° C. to about 90° C.

4. The method of claim 1, wherein the under bump metallurgy layer comprises a titanium layer, a nickel-vanadium layer and a copper layer.

5. The method of claim 1, wherein the adhesive layer comprises an aluminum layer.

6. The method of claim 1, wherein the step of forming the bumps comprises forming a photo-resist layer on the electrically conductive layer to expose the un-removed portions of the electrically conductive layer to form a plurality of openings, filling a solder material into the openings, and removing the photo-resist layer.

7. The method of claim 6, wherein the solder material is filled into the openings by the method of plating.

8. A method of forming a plurality of bumps on a wafer having an active surface, wherein the wafer further comprises a plurality of bonding pads formed on the active surface and a passivation layer formed on the active surface to expose the bonding pads, the method comprising the steps of:

forming an under bump metallurgy layer over the active surface of the wafer, wherein the under bump metallurgy layer comprises an adhesive layer and an electrically conductive layer disposed on the adhesive layer and covering the bonding pads and the passivation layer;

forming a plurality of bumps on portions of the electrically conductive layer disposed above the bonding pads;

removing residual portions of the electrically conductive layer not covered by the bumps; and removing portions of the adhesive layer not covered by the bumps through an etchant, wherein the etchant is a sulfuric acid solution and the concentration of the sulfuric acid solution ranges from about 50% to about 96%.

9. The method of claim 8, wherein the adhesive layer is made of a material selected from one of titanium and copper.

10. The method of claim 8, wherein the step of removing the adhesive layer is performed at a temperature ranging from about 60° C. to about 90° C.

11. The method of claim 8, wherein the under metallurgy layer comprises a titanium layer, a nickel-vanadium layer and a copper layer.

12. The method of claim 8, wherein the adhesive layer comprises an aluminum layer.

13. The method of claim 8, wherein the step of forming the bumps comprises forming a photo-resist layer on the electrically conductive layer to expose portions of the electrically conductive layer disposed above the bonding pads to form a plurality of openings, filling a solder material into the openings, and removing the photo-resist layer.

14. The method of claim 13, wherein the solder material is filled into the openings by the method of plating.

15. The method of claim 8, further comprising a reflowed process to shape the bumps into a ball-like shape after the potions of the adhesive layer not covered by the bumps are removed.

16. The method of claim 8, wherein the bumps comprises solder bumps.

17. The method of claim 8, wherein the bumps comprises lead-free solder bumps.

* * * * *